United States Patent
Kim

(10) Patent No.: US 12,259,438 B2
(45) Date of Patent: Mar. 25, 2025

(54) APPARATUS AND METHOD FOR DIAGNOSING BATTERY

(71) Applicant: LG ENERGY SOLUTION, LTD., Seoul (KR)

(72) Inventor: Young Jin Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 351 days.

(21) Appl. No.: 17/763,245

(22) PCT Filed: Dec. 9, 2020

(86) PCT No.: PCT/KR2020/017927
§ 371 (c)(1),
(2) Date: Mar. 24, 2022

(87) PCT Pub. No.: WO2021/125674
PCT Pub. Date: Jun. 24, 2021

(65) Prior Publication Data
US 2022/0357404 A1    Nov. 10, 2022

(30) Foreign Application Priority Data
Dec. 20, 2019   (KR) .................... 10-2019-0172450

(51) Int. Cl.
*G01R 31/38*      (2006.01)
*G01R 31/367*     (2019.01)
(Continued)

(52) U.S. Cl.
CPC ....... *G01R 31/3835* (2019.01); *G01R 31/367* (2019.01); *G08B 21/18* (2013.01)

(58) Field of Classification Search
CPC .............. G01R 31/3835; G01R 31/367; G01R 31/3648; G01R 19/16542; G08B 21/18; G08B 21/185; Y02E 60/10
See application file for complete search history.

(56) References Cited

U.S. PATENT DOCUMENTS 6,477,024 B1 *  11/2002  Kikuchi ............. G01R 31/3842
                                                           324/432
2001/0028238 A1   10/2001  Nakamura et al.
(Continued)

FOREIGN PATENT DOCUMENTS

EP    1 037 063 A1    9/2000
EP    3572890 A1 *   11/2019 ........... G05B 19/042
(Continued)

OTHER PUBLICATIONS

Extended European Search Report issued on Sep. 9, 2022 for the corresponding European patent application No. 20901122.0.
(Continued)

*Primary Examiner* — Catherine T. Rastovski
*Assistant Examiner* — Lal C Mang
(74) *Attorney, Agent, or Firm* — Birch, Stewart, Kolasch & Birch, LLP

(57) ABSTRACT

An apparatus for diagnosing a battery may include a voltage measurement unit that measures a voltage of a battery cell, a fitting equation calculation unit that calculates a fitting equation for the voltage of the battery cell, and a diagnostic unit that diagnoses whether or not the battery cell is abnormal based on the fitting equation for the voltage of the battery cell.

13 Claims, 11 Drawing Sheets

(51) Int. Cl.
*G01R 31/3835* (2019.01)
*G08B 21/18* (2006.01)

(56) References Cited

U.S. PATENT DOCUMENTS

| | | | |
|---|---|---|---|
| 2003/0062875 A1 | 4/2003 | Nakamura et al. | |
| 2004/0251875 A1 | 12/2004 | Kinoshita et al. | |
| 2005/0206390 A1 | 9/2005 | Nakamura et al. | |
| 2005/0208368 A1 | 9/2005 | Nakamura et al. | |
| 2005/0208389 A1 | 9/2005 | Nakamura et al. | |
| 2005/0214633 A1 | 9/2005 | Nakamura et al. | |
| 2006/0181245 A1 | 8/2006 | Mizuno et al. | |
| 2008/0234956 A1* | 9/2008 | Mizuno | G01R 31/367 702/63 |
| 2009/0030626 A1 | 1/2009 | Iwane et al. | |
| 2010/0153038 A1 | 6/2010 | Tomura et al. | |
| 2011/0301891 A1 | 12/2011 | Kim | |
| 2012/0025769 A1* | 2/2012 | Kikuchi | B60L 58/14 320/118 |
| 2012/0091954 A1 | 4/2012 | Matsuki | |
| 2012/0182021 A1* | 7/2012 | McCoy | G01R 31/3832 324/433 |
| 2014/0035537 A1* | 2/2014 | Hong | B60L 3/12 320/162 |
| 2015/0127281 A1* | 5/2015 | Kusano | G01R 31/3648 702/63 |
| 2015/0153417 A1 | 6/2015 | Maluf et al. | |
| 2015/0226809 A1 | 8/2015 | Joe et al. | |
| 2016/0149422 A1 | 6/2016 | Dai et al. | |

FOREIGN PATENT DOCUMENTS

| | | | | |
|---|---|---|---|---|
| JP | 2000-28690 | A | | 1/2000 |
| JP | 2005-3414 | A | | 1/2005 |
| JP | 2006-90847 | A | | 4/2006 |
| JP | 2008-226789 | A | | 8/2006 |
| JP | 2008-191103 | A | | 8/2008 |
| JP | 2008-241246 | A | | 10/2008 |
| JP | 2008-256436 | A | | 10/2008 |
| JP | 2010-14636 | A | | 1/2010 |
| JP | 2010014636 | A | * | 1/2010 ............ G01R 31/36 |
| JP | 2010-38718 | A | | 2/2010 |
| JP | 2012-225713 | A | | 11/2012 |
| JP | 5170876 | B2 | | 3/2013 |
| JP | 6138216 | B2 | | 5/2017 |
| JP | 2017-97997 | A | | 6/2017 |
| JP | 2017097997 | A | * | 6/2017 ............ Y02E 60/10 |
| JP | 2017-199577 | A | | 11/2017 |
| JP | 2018-72346 | A | | 5/2018 |
| JP | 2019-32987 | A | | 2/2019 |
| KR | 10-0438744 | B1 | | 7/2004 |
| KR | 10-0447461 | B1 | | 9/2004 |
| KR | 10-1454832 | B1 | | 10/2014 |
| KR | 10-1865402 | B1 | | 7/2018 |
| KR | 10-2018-0107958 | A | | 10/2018 |
| KR | 10-2019-0071342 | A | | 6/2019 |
| WO | WO 2012/004848 | A1 | | 1/2012 |

OTHER PUBLICATIONS

International Search Report (PCT/ISA/210) issued in PCT/KR2020/017927 mailed on Mar. 26, 2021.

* cited by examiner

APPARATUS AND METHOD FOR DIAGNOSING BATTERY

CROSS-REFERENCE TO RELATED APPLICATION

This application claims the benefit of Korean Patent Application No. 10-2019-0172450, filed on Dec. 20, 2019, in the Korean. Intellectual Property Office, the disclosure of which is incorporated herein in its entirety by reference.

TECHNICAL FIELD

The present invention relates to an apparatus and method for diagnosing a battery for detecting an abnormal voltage drop phenomenon during charging of a battery cell.

Background Art

Recently, research and development on a secondary battery are being actively conducted Here, the secondary battery is a battery capable of charging and discharging, and is meant to include all of a conventional Ni/Cd battery, Ni/NH battery, etc. and a recent lithium ion battery. Among the secondary batteries, the lithium ion battery has an advantage of having much higher energy density compared to the conventional Ni/Cd battery, Ni/MH battery, etc. In addition, the lithium ion battery can be manufactured in a small size and light weight, and thus the lithium ion battery is used as a power source for a mobile device. In addition, the lithium ion battery can be manufactured in a small size and light weight, and thus the lithium ion battery is used as a power source for a mobile device. In addition, the lithium ion battery is attracting attention as a next-generation energy storage medium as its range of use has been expanded to a power source for an electric vehicle.

In addition, the secondary battery is generally used as a battery pack including a battery module in which a plurality of battery cells are connected in series and/or in parallel. In addition, a state and operation of the battery pack are managed and controlled by a battery management system.

In the case of such a secondary battery, an abnormal voltage drop phenomenon suspected of an internal short may be observed during a charging cycle. In order to diagnose such an abnormal voltage drop, a method of detecting whether or not a voltage decreases by measuring a voltage of a battery is used. However, according to this method, when the voltage drop due to the internal short of the battery occurs over the entire section, the voltage drop phenomenon can be detected, but there is a problem that detection is impossible when the voltage drop occurs instantaneously.

DISCLOSURE OF THE INVENTION

Technical Problem

An object of the present invention is to provide, an apparatus and method for diagnosing a battery capable of accurately and easily detecting an abnormal voltage drop due to an internal short during charging of a battery by using a fitting equation for the voltage of the battery.

Technical Solution

An apparatus for diagnosing a battery according to an embodiment of the present invention may include a voltage measurement unit configured to measure a voltage of a battery cell, a fitting equation calculation unit configured to calculate a fitting equation for the voltage of the battery cell, and a diagnostic unit configured to diagnose whether or not the battery cell is abnormal based on the fitting equation for the voltage of the battery cell.

A method for diagnosing a battery according to an embodiment of the present invention may include measuring a voltage of a battery cell, calculating a fitting equation for the voltage of the battery cell, and diagnosing whether or not the battery cell is abnormal based on the fitting LS equation for the voltage of the battery cell.

Effects of the Invention

According to the apparatus and method for diagnosing the battery of the present invention, it is possible to accurately and easily detect an abnormal voltage drop phenomenon due to an internal short during charging of a battery by using a ft ting equation for a voltage of the battery.

MODE FOR CARRYING OUT THE INVENTION

Figure 1:
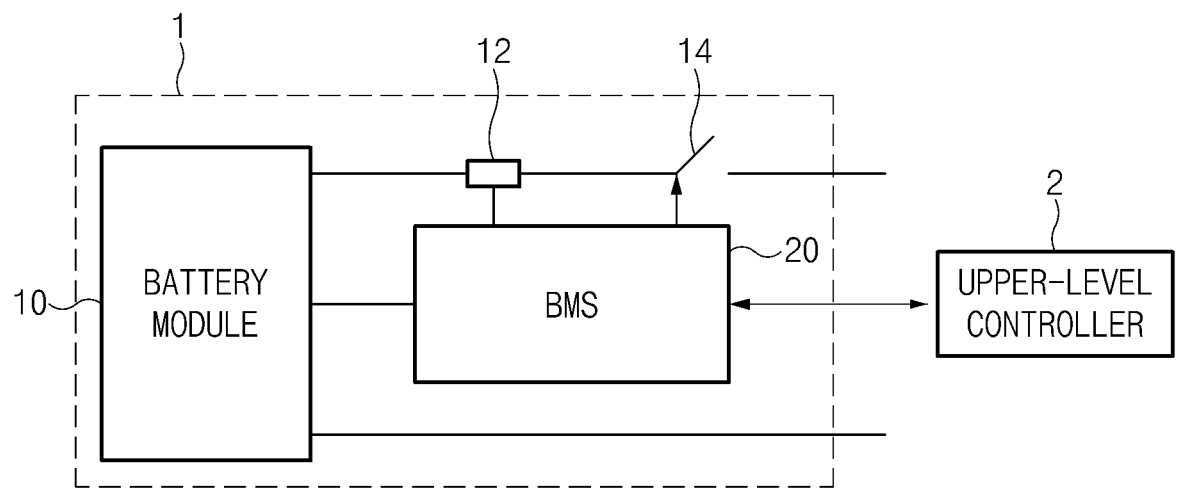
FIG. 1 is a block diagram illustrating a configuration of a battery control system.

Hereinafter, various embodiments of the present invention will be described in detail with reference to the accompanying drawings. In this document, the same reference numerals are used for the same constituent elements in the drawings, and duplicate descriptions for the same constituent elements are omitted.

With respect to the various embodiments of the present invention disclosed in this document, specific structural or functional descriptions have been exemplified for the purpose of describing the embodiments of the present invention only, and various embodiments of the present invention may be embodied in various forms and should not be construed as being limited to the embodiments described in this document.

Expressions such as "first", "second", "firstly", or "secondly", etc. used in various embodiments may modify various constituent elements regardless of order and/or importance, and do not limit corresponding constituent elements. For example, without deviating from the scope of the present invention, a first constituent element may be named as a second constituent element, and similarly, the second constituent element may also be renamed as the first constituent element.

The terms used in this document are only used to describe a specific embodiment, and may not be intended to limit the scope of other embodiments. Singular expressions may include plural expressions unless they are clearly meant differently in the context.

All terms used herein, including technical or scientific terms, may have the same meaning as generally understood by a person having an ordinary skill in the technical field of the present invention. Terms defined in a generally used dictionary may be interpreted as having the same or similar meaning as the meaning in the context of the related technology, and are not to be interpreted as an ideal or excessively formal meaning unless explicitly defined in this document. In some cases, even terms defined in this document cannot be interpreted to exclude embodiments of the present invention.

FIG. 1 is a block diagram illustrating a configuration of a battery control system.

Referring to FIG. 1, a battery management system including a battery pack 1 and an upper-level controller 2 included in an upper-level system according to an embodiment of the present invention is schematically illustrated.

As illustrated in FIG. 1, the battery pack 1 includes a battery module 10 composed of one or more battery cells and capable of charging and discharging, a switching unit 14 (e.g., switching assembly or switch) connected in series to a positive terminal side or a negative terminal side of the battery module 10 to control a charge and discharge current flow of the battery module 10, and a battery management system 20 (BMS) that monitors a voltage, current, temperature, etc. of the battery pack 1 to control and manage the battery module 10 to prevent over-charging, over-discharging, etc.

Here, the switching unit 14 is a semiconductor switching element for controlling a current flow for charging or discharging of the battery module 10, and, for example, at least one MOSFET may be used.

In addition, the BMS 20 may measure or calculate a voltage and current of a gate, source, and drain of the semiconductor switching element in order to monitor the voltage, current, temperature, etc. of the battery pack 1, and may measure the current, voltage, temperature, etc. of the battery pack using a sensor 12 provided adjacent to the semiconductor switching element 14. The BMS 20 is an interface that receives values obtained by measuring various parameters described above, and may include a plurality of terminals and a circuit connected to these terminals to perform processing for input values.

In addition, the BMS 20 may control ON/OFF of the switching element 14, for example, metal-oxide-semiconductor field-effect transistor (MOSFET), and may be connected to the battery module 10 to monitor a state of the battery module 10.

The upper-level controller 2 may transmit a control signal for the battery module to the BMS 20. Accordingly, an operation of the BMS 20 may be controlled based on a signal applied from the upper-level controller. The battery cell of the present invention may be configured to be included in a battery pack used in an energy storage system (ESS) or a vehicle, etc. However, it is not limited to these uses.

Since the configuration of the battery pack 1 and the configuration of the BMS 20 are known configurations, a more detailed description thereof will be omitted.

Figure 2:
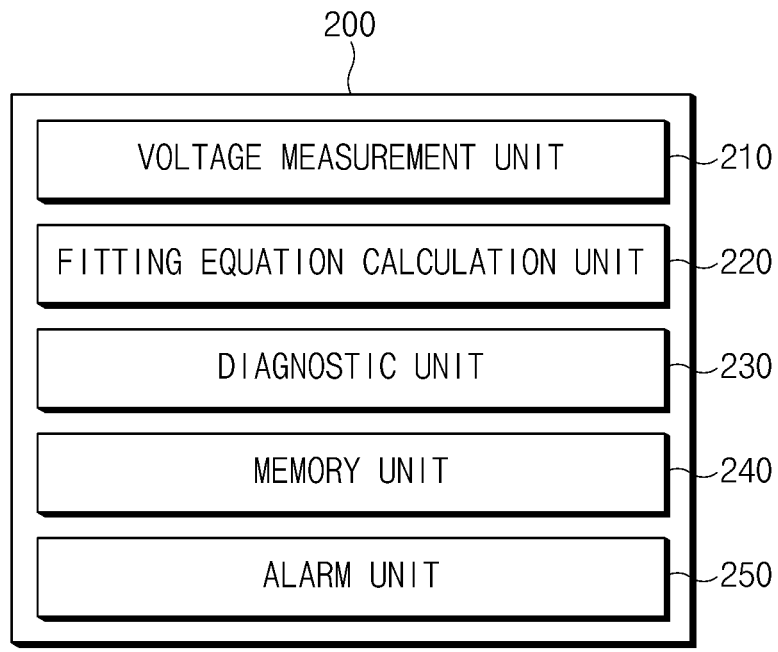
FIG. 2 is a block diagram illustrating a configuration of an apparatus for diagnosing a battery according to an embodiment of the present invention.

FIG. 2 is a block diagram illustrating a configuration of an apparatus for diagnosing a battery according to an embodiment of the present invention.

Referring to FIG. 2, an apparatus 200 for diagnosing a battery according to an embodiment of the present invention may include a voltage measurement unit 210 (e.g., voltage measurer), a fitting equation calculation unit 220 (e.g., fitting equation calculator), a diagnostic unit 230 (e.g., diagnostic member), a memory unit 240 (e.g., memory), and an alarm unit 250 (e.g., alarm or alarm member).

The voltage measurement unit 210 may measure the voltage of the battery cell. In this case, the voltage measurement unit 210 may measure the voltage of the battery cell at predetermined time intervals.

The fitting equation calculating unit 220 may calculate a fitting equation for the voltage of the battery cell. In this case, the fitting equation calculated by the fitting equation calculation unit 220 may be a model voltage representing a voltage profile of the battery cell. For example, the fitting equation may be an exponential equation. In addition, the fitting equation calculation unit 220 may calculate the fitting equation by least a square estimation. However, this is only exemplary, and the present invention is not limited thereto, and the fitting equation calculation unit 220 may calculate the fitting equation in various ways.

The fitting equation calculation unit 220 may calculate a fitting equation for a voltage in a rest section during which a voltage drop phenomenon due to an internal short of the battery occurs after charging of the battery cell is completed.

The diagnostic unit 230 may diagnose whether or not the battery cell is abnormal based on the fitting equation for the voltage of the battery cell calculated by the fitting equation calculation unit 220. Specifically, when a difference between the voltage of the battery cell measured by the voltage measurement unit 210 and the voltage according to the fitting equation calculated by the fitting equation calculation unit 220 is greater than or equal to a preset reference value, the diagnostic unit 230 may determine that the battery is abnormal. In this case, the reference value may be set based on a predetermined measurement error value of the voltage measurement unit 210.

The memory unit 240 (e.g., volatile or non-volatile physical memory) may store the voltage of the battery cell measured by the voltage measurement unit 210 and the fitting equation for the voltage of the battery cell calculated by the approximation calculation unit 220. In this case, the memory unit 240 may be included in the apparatus 200 for diagnosing the battery, and may be included in an external server to transmit and receive data to and from the apparatus 200 for diagnosing the battery through a separate communication module.

The alarm unit 250 may generate a warning alarm when it is determined that an abnormality has occurred in the battery cell by the diagnostic unit 230. In this case, the warning alarm may be provided in the form of a message on a display unit (e.g., a display device), or may be provided as light or sound signals.

As described above, according to the apparatus for diagnosing the battery according to an embodiment of the present invention, it is possible to accurately and easily detect the abnormal voltage drop phenomenon due to the internal short during charging of the battery by using the fitting equation for the voltage of the battery cell.

Figure 3A:
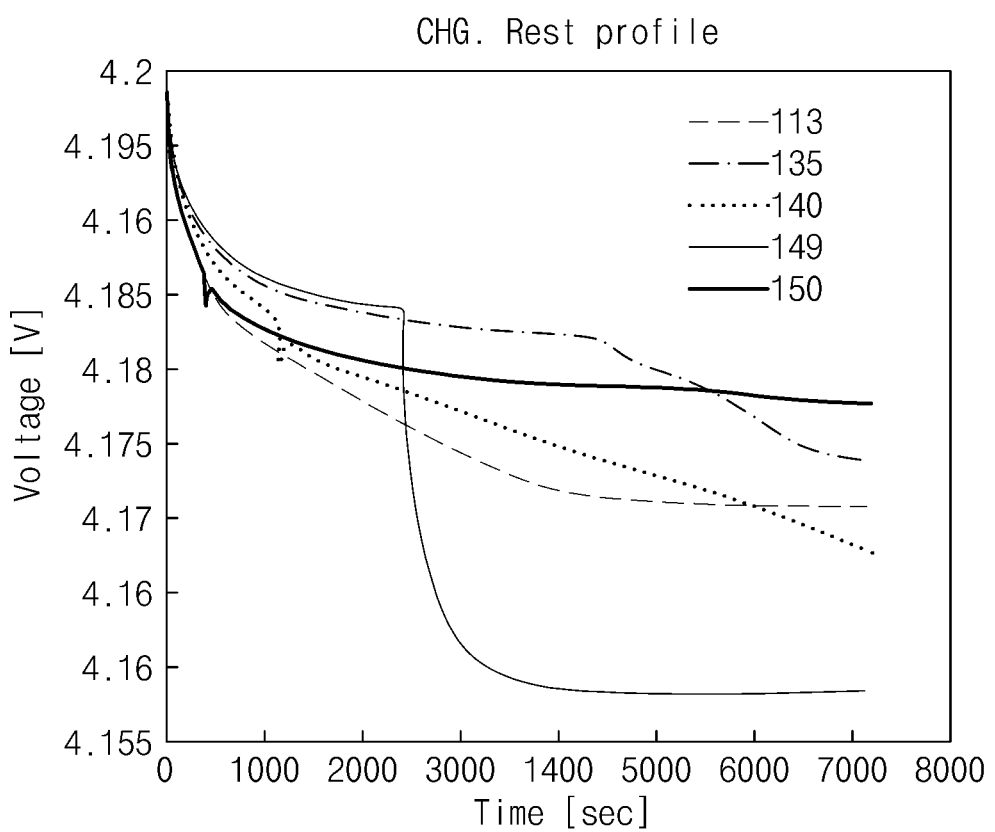
FIG. 3A is a graph illustrating a voltage change when a voltage drop due to an internal short of a battery cell occurs over an entire section.
Figure 3B:
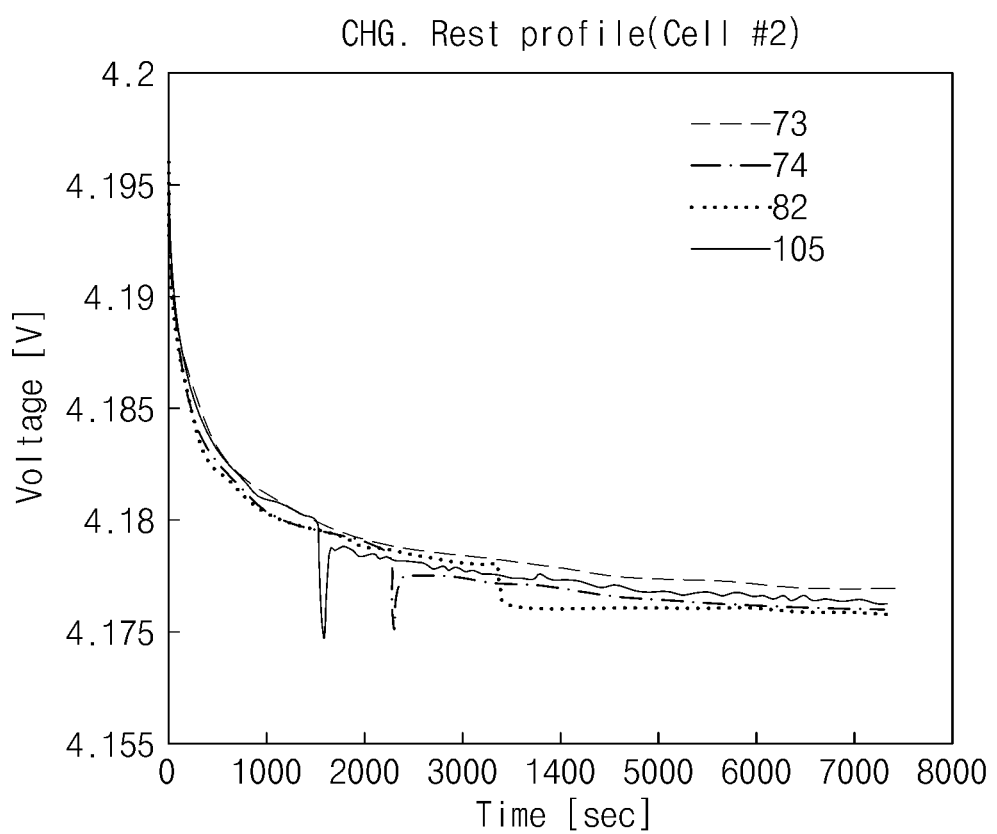
FIG. 3B is a graph illustrating a voltage change when the voltage drop due to the internal short of the battery cell occurs temporarily.

FIG. 3A is a graph illustrating a voltage change when the voltage drop due to the internal short of the battery cell occurs over an entire section, and FIG. 3B is a graph illustrating the voltage change when the voltage drop due to the internal short of the battery cell occurs temporarily. Here, the horizontal axis of FIGS. 3A and 3B represents time (seconds), and the vertical axis thereof represents voltage (V) of the battery.

Referring to FIG. 3A, it may be seen that, for the case of the 113, 135, 140, 149 and 150-th charging cycles, the voltage drop due to the internal short of the battery cell in the rest section after charging of the battery gradually appears over the entire section.

In addition, referring to FIG. 3B, it may be seen that, for the case of the 73, 74, 82, and 105-th charging cycles, the voltage drop due to the internal short of the battery cell in the rest section after charging of the battery occurs temporarily in the section of about 1500 seconds, section of about 2300 seconds, etc.

Figure 4A:
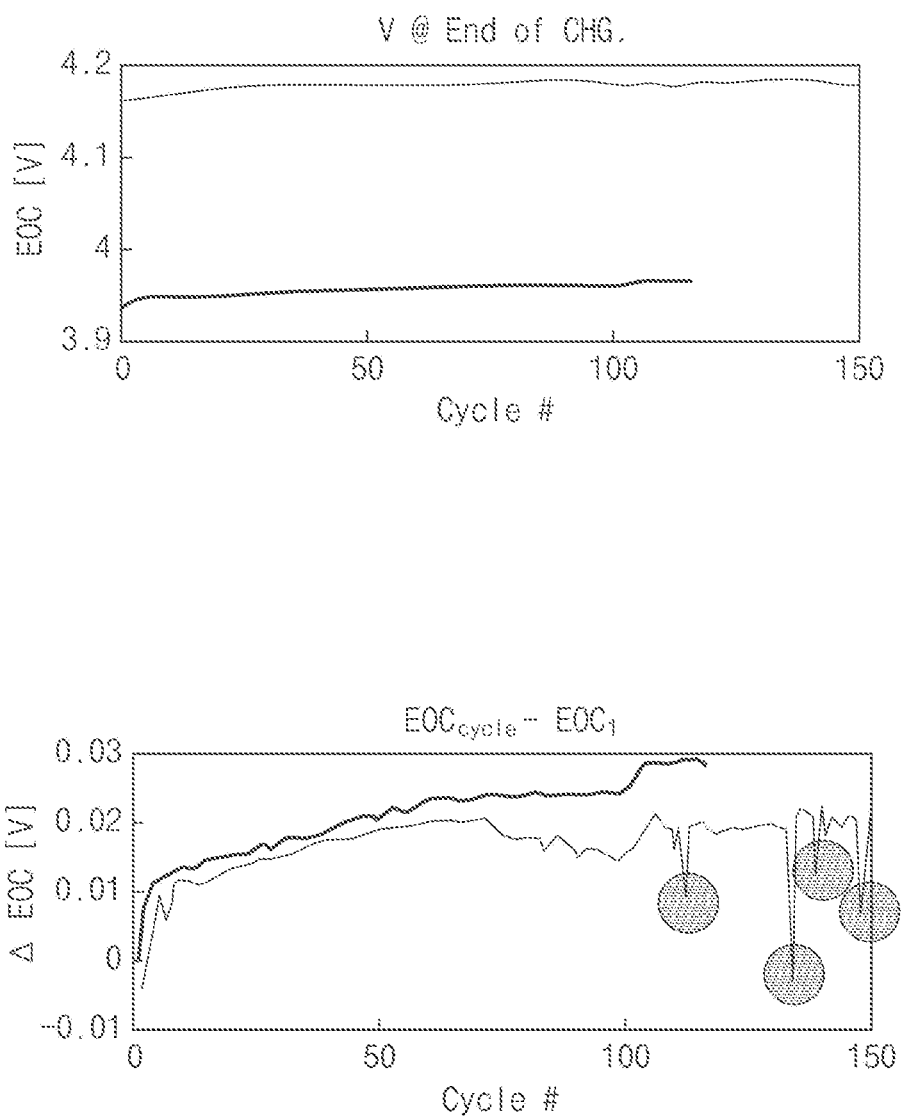
FIG. 4A is a graph illustrating an end of charge (EOC) when the voltage drop due to the internal short of the battery cell occurs over the entire section, and 4B is a graph illustrating the EOC when the voltage drop due to the internal short of the battery cell occurs temporarily.
Figure 4B:
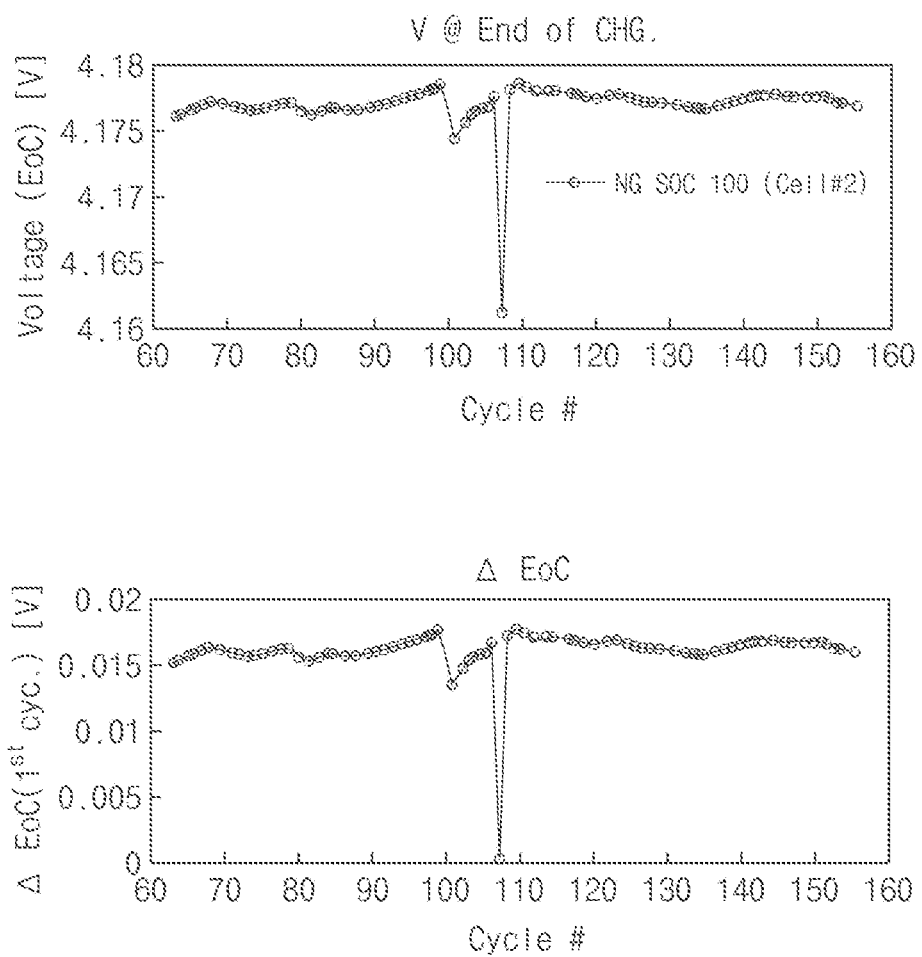

FIG. 4A is a graph illustrating an end of charge (EOC) when the voltage drop due to the internal short of the battery cell occurs over the entire section, and FIG. 4B is a graph illustrating the EOC when the voltage drop due to the internal short of the battery cell occurs temporarily;

The upper Graph of FIG. 4A illustrates a voltage change in the end of charge (EOC) (vertical axis) with respect to the number of charging cycles (horizontal axis) of the battery, and the lower graph of FIG. 4A illustrates a change in the EOC (vertical axis) with respect to the number of charging cycles (horizontal axis) of the battery.

As illustrated in FIG. 4A, when the voltage drop due to the internal short of the battery cell occurs over the entire section, it may be seen that an abrupt voltage drop appears in the EOC as well. That is, referring to the lower graph of FIG. 4A, it may be seen that the voltage drop phenomenon appears in the sections (shaded portions) of the lower graph of FIG. 4A) in which the numbers of charging cycles are 113, 135, 140, and 149.

Meanwhile, the upper graph of FIG. 4B illustrates the voltage change in EOC (end of charge) (vertical axis) with respect to the number of charging cycles (horizontal axis) of the battery, and the lower graph of FIG. 4B illustrates the EOC change (vertical axis) with respect to the number of charging cycles (horizontal axis) of the battery.

As illustrated in FIG. 4B, when the voltage drop due to the internal short of the battery cell occurs temporarily and it is recovered again after an instantaneous voltage drop, it is impossible to detect the voltage drop due to the internal short using only the EOC.

Figure 5:
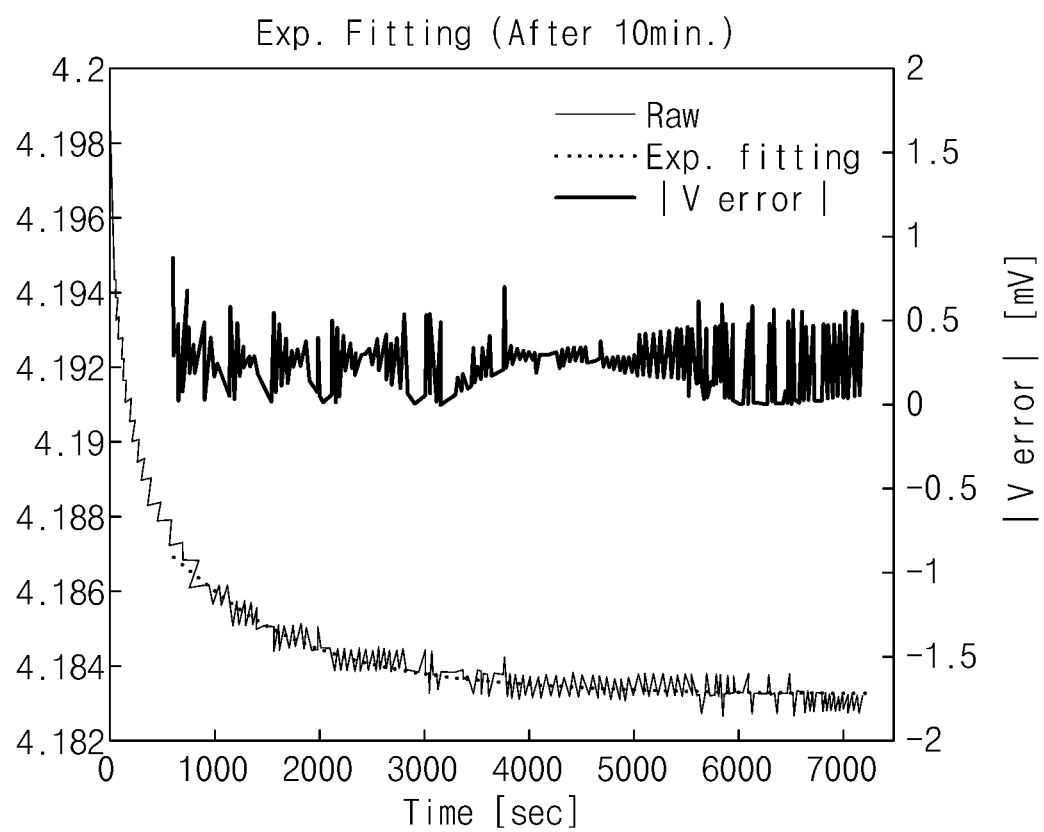
FIG. 5 is a graph illustrating a difference value between an actual rest voltage of a battery and a voltage according to a fitting equation.

FIG. 5 is a graph illustrating an actual rest voltage for about 10 minutes after charging of the battery, a voltage according to a fitting equation, and a difference value therebetween. In this case, the horizontal axis of FIG. 5 represents time (seconds), the vertical axis (left) represents voltage (V) of the battery, and the vertical axis (right) represents a difference value $V_{error}$(mV) between the actual measured voltage of the battery and the voltage according to the fitting equation.

The fitting equation of the battery voltage in FIG. 5 is derived through the least square estimation. In this case, the fitting equation of the battery voltage can be expressed as follows.

$$y_{fit} = a \times \exp(b \cdot t) - c$$

In the apparatus for diagnosing the battery according to an embodiment of the present invention, the fitting equation or the battery voltage may be completed by respectively computing constants a, b, and c of the above equation. However, the above equation is only illustrated as an example, and the present invention is not limited thereto, and various equations capable of making the voltage of the battery fir may be used.

Referring to FIG. 5, a difference value between an actual measured rest voltage (raw) of the battery and a voltage (Exp.fitting) according to the fitting equation is represented as $|V_{error}|$ in the center of the graph. By calculating the difference value between the actual measured voltage of the battery and the voltage according to the fitting equation and comparing the difference value with a reference value, the voltage drop due to the internal short in the rest section of the battery may be detected.

Figure 6A:
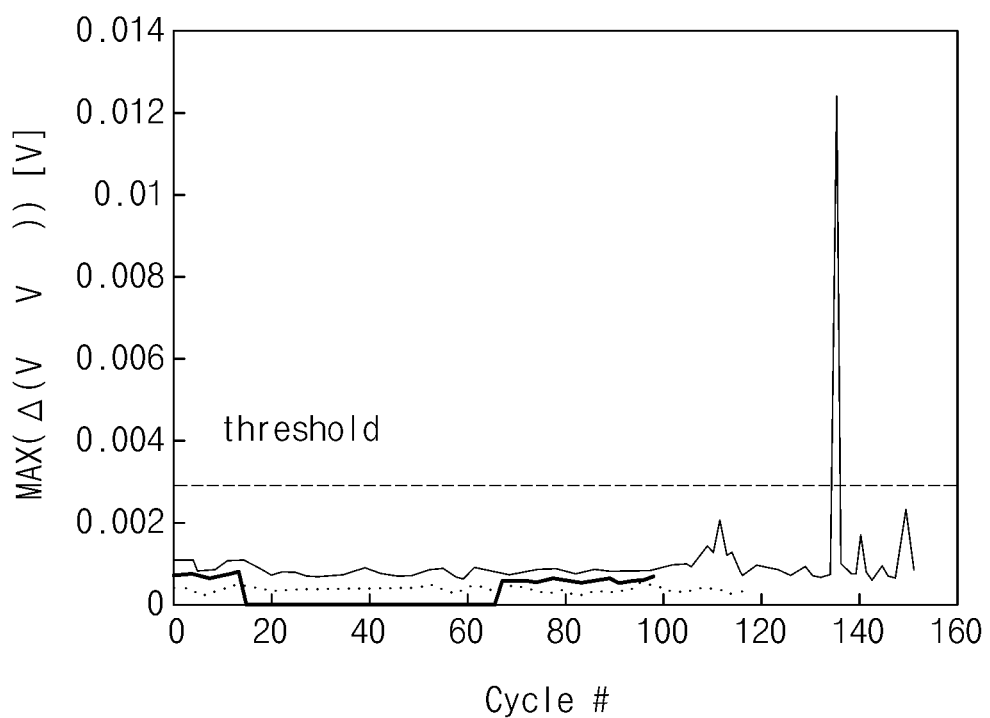
FIG. 6A illustrates a result of detecting, by the apparatus for diagnosing the battery according to an embodiment of the present invention, that the voltage drop due to the internal short of the battery cell occurs over the entire section.
Figure 6B:
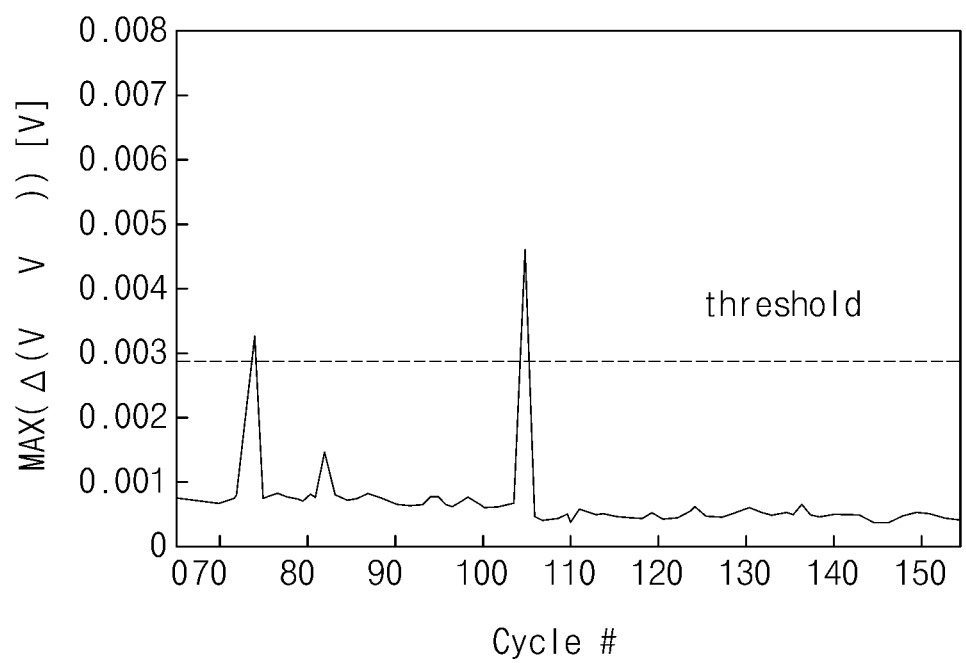
FIG. 6B illustrates a result of detecting that the voltage drop due to the internal short of the battery cell occurs temporarily.

FIG. 6A illustrates a result of detecting, by the apparatus for diagnosing the battery according to an embodiment of the present invention, that the voltage drop due to the internal short of the battery cell occurs over the entire section, and FIG. 6B illustrates a result of detecting that the voltage drop due to the internal short of the battery cell occurs temporarily.

In this case, the horizontal axis of FIGS. 6A and 6B represents the number of charging cycles of the battery, and the vertical axis thereof represents the maximum value (V) of a difference value between the actual measured voltage of the battery and the voltage according to the fitting equation.

Referring to FIG. 6A, for the case where the voltage drop due to the internal short of the battery cell occurs over the entire section, the difference value between the actual measured voltage of the battery and the voltage according to the fitting equation is compared with a preset reference value, and when the difference value is greater than or equal to the reference value (cycle 135 of FIG. 6A), it may be determined that the voltage drop due to the internal short of the battery cell has occurred.

Similarly, referring to FIG. 6B, even for the case where the voltage drop due to the internal short of the battery cell occurs temporarily, the difference value between the actual measured voltage of the battery and the voltage according to the fitting equation is compared with a preset reference value, and when the difference value is greater than or equal to the reference value (cycles 74 and 105 in FIG. 6B), it may be determined chat the voltage drop due to the internal short of the battery cell has occurred. In this case, the reference values of FIGS. 6A and 6B may be determined based on a measurement range of a voltage sensor itself.

As such, according to the apparatus for diagnosing the battery according to an embodiment of the present invention, by diagnosing the voltage drop by comparing the difference value between the actual measured voltage of the battery and the voltage according to the fitting equation with the reference value, it is possible to diagnose whether or not an abnormality has occurred not only for the case where when the voltage drop due to the internal short of the battery cell occurs over the entire section, but also the case where the voltage drop occurs temporarily.

Figure 7:
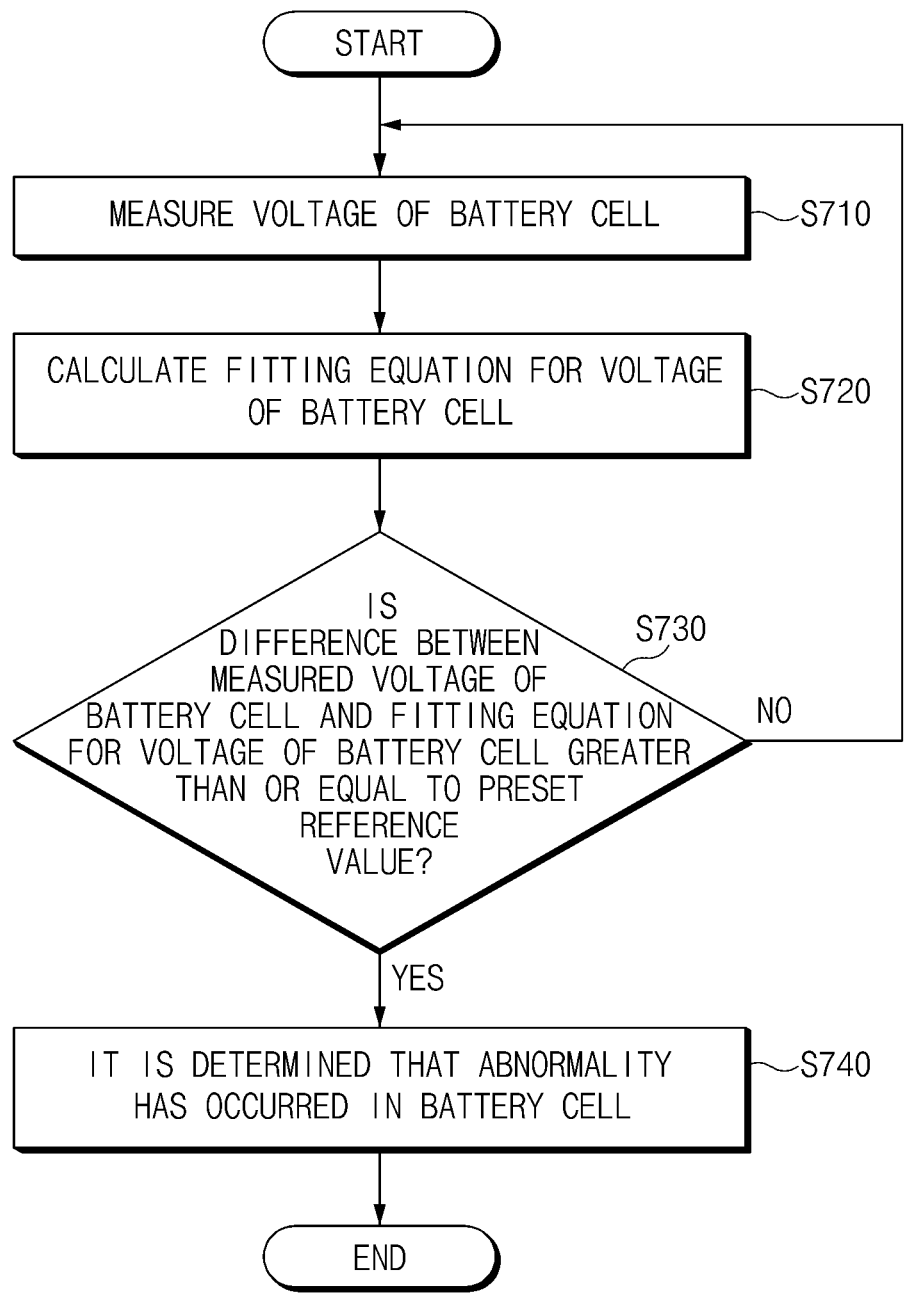
FIG. 7 is a flowchart illustrating a method for diagnosing a battery according to an embodiment of the present invention.

FIG. 7 is a flowchart illustrating a method for diagnosing a battery according to an embodiment of the present invention.

Referring to FIG. 7, first, a voltage of a battery cell is measured (S710). In this case, the voltage of the battery cell may be measured at predetermined time intervals In addition, a fitting equation for the voltage of the battery cell is calculated (S720). In this case, the fitting equation may be calculated through the least squares estimation. In addition, in step S720, the fitting equation for the voltage in the rest section after charging of the battery cell is completed may be calculated.

Next, it is determined whether or not a difference between the voltage of the battery cell measured in step S710 and the fitting equation for the voltage of the battery cell calculated in step S720 is greater than or equal to a preset reference value (S730). If the difference between the measured voltage of the battery cell and the fitting equation for the calculated voltage of the battery cell is less than the preset reference value (NO), the process returns to step S710.

On the other hand, if the difference between the measured voltage of the battery cell and the approximation of the calculated voltage of the battery cell is greater than or equal to the preset reference value (YES), it is determined that an abnormality (e.g., voltage drop due to the internal short of the battery) of the battery cell has occurred (S740).

As described above, according to the method for diagnosing the battery according to an exemplary embodiment of the present invention, it is possible to accurately and easily detect an abnormal voltage drop phenomenon due to the internal short during battery charging by using a fitting equation for the voltage of the battery cell.

Figure 8:
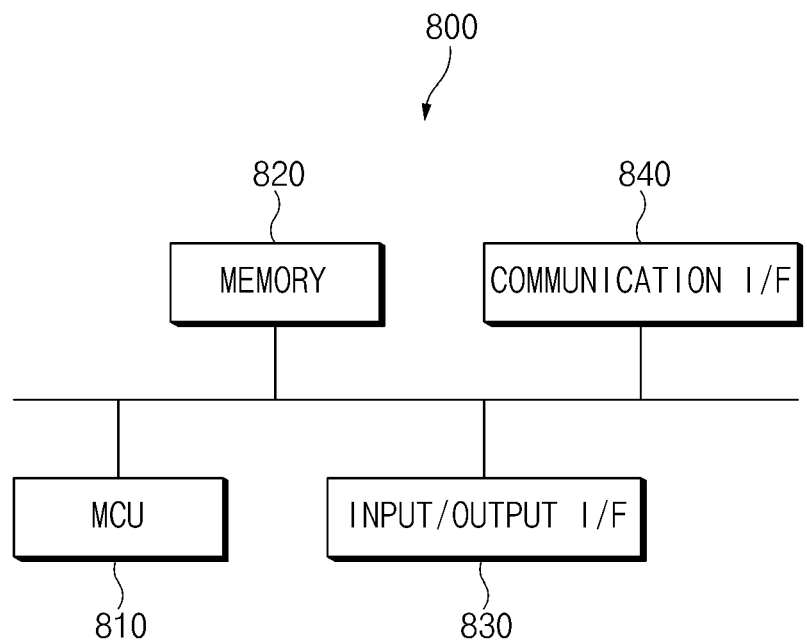
FIG. 8 is a diagram illustrating a hardware configuration of the apparatus for diagnosing the battery according to the embodiment of the present invention.

FIG. 8 is a diagram illustrating a hardware configuration of the apparatus for diagnosing the battery according to the embodiment of the present invention.

Referring to FIG. 8, an apparatus 800 for diagnosing a battery may include a microcontroller (MCU) 810 that controls various processes and configurations, a memory 820 in which an operating system program and various programs (e.g., a battery diagnostic program, a voltage fitting equation calculation program, etc.) are recorded, an input/output interface 830 that provides an input interface and an output interface between the battery cell module and/or the semiconductor switching element, and a communication interface 840 capable of communicating with the outside through a wired or wireless communication network. As described above, the computer program according to the present invention may be implemented as, for example, a module that performs each functional block illustrated in FIG. 2 by being recorded in the memory 820 and processed by the microcontroller 810.

In the above description, just because all constituent elements constituting an embodiment of the present invention are described as being combined into one or operating in combination, the present invention is not necessarily limited to these embodiments. That is, as long as it is within the scope of the object of the present invention, all constituent elements may be selectively combined and operated in one or more.

In addition, the terms such as "include", "configure" or "have" described above mean that the corresponding constituent element may be embedded unless otherwise particularly described, and thus the terms should be interpreted as being capable of further including other constituent elements, rather than excluding other constituent elements. All terms used herein including technical or scientific terms may have the same meaning as generally understood by a person having an ordinary skill in the technical field to which the present invention pertains, unless otherwise defined. Terms generally used, such as terms defined in the dictionary, should be interpreted as being consistent with the meaning of the context of related technology, and are not to be interpreted as an ideal or excessively formal meaning unless explicitly defined in the present invention.

The above description is merely illustrative of the technical idea of the present invention, and those having ordinary skill in the art to which the present invention pertains will be able to make various modifications and variations thereto in a range without deviating from the essential characteristics of the present invention. Accordingly, the embodiments disclosed in the present invention are not intended to limit the technical idea of the present invention, but to explain the technical idea, and the scope of the technical idea of the present invention is not limited by these embodiments. The scope of protection of the present invention should be interpreted by the claims set forth below, and all technical ideas within the scope equivalent thereto should be construed as being included in the scope of rights of the present invention.

The invention claimed is:

1. An apparatus for diagnosing a battery, the apparatus comprising:
 a voltage measurer configured to measure a voltage of a battery cell;
 a controller configured to:
  calculate a fitting equation for the voltage of the battery cell; and
  diagnose whether or not the battery cell is abnormal based on the fitting equation for the voltage of the battery cell; and
 an alarm configured to generate a warning alarm when it is determined that an abnormality has occurred in the battery cell,
 wherein the controller is configured to diagnose that the battery is abnormal when a difference between the voltage of the battery cell measured by the voltage measurer and a model voltage determined by the fitting equation for the voltage of the battery cell is greater than or equal to a reference value,
 wherein the reference value is set based on a predetermined measurement error value of the voltage measurer and a measurement range of the voltage measurer, and
 wherein the controller is configured to calculate the fitting equation for the voltage in a rest section after charging of the battery cell is completed to determine whether a voltage drop phenomenon due to an internal short of the battery cell occurs during the rest section.

2. The apparatus of claim 1,
 wherein the controller is configured to calculate the fitting equation by least square estimation.

3. The apparatus of claim 1,
 wherein the fitting equation is the model voltage representing a voltage profile of the battery cell.

4. The apparatus of claim 3,
 wherein the fitting equation is an exponential fitting equation.

5. The apparatus of claim 1, further comprising:
 a memory configured to store the voltage of the battery cell measured by the voltage measurer and the fitting equation for the voltage of the battery cell calculated by the controller.

6. A method for diagnosing a battery, the method comprising:
 measuring a voltage of a battery cell by a voltage measurer;
 calculating a fitting equation for the voltage of the battery cell; and diagnosing whether or not the battery cell is abnormal based on the fitting equation for the voltage of the battery cell, wherein, in the diagnosing whether or not the battery cell is abnormal, it is diagnosed that the battery is abnormal when a difference between the measured voltage of the battery cell and a model voltage determined by the fitting equation for the voltage of the battery cell is greater than or equal to a reference value, wherein when it is determined that an abnormality has occurred in the battery cell, an alarm generates a warning alarm, wherein the reference value is set based on a predetermined measurement error value of the voltage measurer and a measurement range of the voltage measurer, and wherein the calculating the fitting equation comprises calculating the fitting equation for the voltage in a rest section after charging of the battery cell is completed to determine whether a voltage drop phenomenon due to an internal short of the battery cell occurs during the rest section.

7. A battery pack comprising:
the apparatus of claim 1;
a battery management system (BMS);
a switching unit configured to control the charging or a discharging of the battery cell; and
an upper-level controller.

8. The battery pack of claim 7, wherein the switching unit is controlled to discharge the battery when the controller diagnoses the battery as abnormal.

9. The battery pack of claim 7, wherein the switching unit comprises at least one metal-oxide-semiconductor field-effect transistor (MOSFET).

10. The battery pack of claim 7, wherein an operation of the BMS is controlled based on a signal applied from the upper-level controller.

11. The apparatus of claim 5, wherein the memory includes an external server configured to transmit and receive data to and from the apparatus for diagnosing the battery through a separate communication module.

12. The apparatus of claim 1, further comprising a display,
wherein the warning alarm is displayed as a message on the display.

13. The apparatus of claim 1, wherein the controller is configured to calculate the fitting equation (Y fit) for the voltage of the battery cell using the following formula:

$$y_{fit} = a \times \exp(b \cdot t) - c$$

wherein a, b and c are calculated constants and t is time.

* * * * *